(12) United States Patent
Lee et al.

(10) Patent No.: US 10,749,514 B2
(45) Date of Patent: Aug. 18, 2020

(54) GAN BASED ADJUSTABLE DRIVER CURRENT CIRCUIT

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US); John S. Glaser, Niskayuna, NY (US); Stephen L. Colino, Bear, DE (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/558,409

(22) Filed: Sep. 3, 2019

(65) Prior Publication Data

US 2020/0076413 A1 Mar. 5, 2020

Related U.S. Application Data

(60) Provisional application No. 62/727,115, filed on Sep. 5, 2018.

(51) Int. Cl.
*H03K 17/00* (2006.01)
*H03K 5/24* (2006.01)
*G01S 17/89* (2020.01)

(52) U.S. Cl.
CPC ............ *H03K 5/2472* (2013.01); *G01S 17/89* (2013.01); *H03K 17/00* (2013.01); *H03K 17/002* (2013.01)

(58) Field of Classification Search
CPC .............................. H03K 5/2472; G01S 17/89
See application file for complete search history.

(56) References Cited

U.S. PATENT DOCUMENTS

| 7,453,424 B2 * | 11/2008 | Johnson | G09G 3/3233 345/76 |
| 7,932,622 B2 * | 4/2011 | Chiozzi | H03K 17/04106 307/10.1 |

(Continued)

FOREIGN PATENT DOCUMENTS

WO   WO 2017/190652 A1   11/2017

*Primary Examiner* — Dinh T Le
(74) *Attorney, Agent, or Firm* — Blank Rome LLP

(57) ABSTRACT

A circuit for providing an adjustable output driver current for use in LiDAR or other similar GaN driver applications. The circuit creates an appropriate gate-to-source voltage, $V_{GS}$, for a high-current GaN driver FET to obtain a desired, high slew-rate driver current, $I_{DRV}$. An externally provided reference current is used to create the required $V_{GS}$ for the driver FET, which is stored on an external capacitor. The value of the capacitor far exceeds the relatively low input-capacitance of the GaN driver FET. When a pulse $I_{DRV}$ of desired value is needed, the voltage on the capacitor is impinged upon the gate of the driver FET, thereby creating the desired $I_{DRV}$. The reference charging circuit replenishes any charge lost on the capacitor, so that the same desired $I_{DRV}$ can be obtained on the next command pulse.

5 Claims, 2 Drawing Sheets

(56) References Cited

U.S. PATENT DOCUMENTS

| | | | |
|---|---|---|---|
| 8,004,318 B2 * | 8/2011 | Boezen | H03K 17/687 327/108 |
| 8,558,587 B2 | 10/2013 | Machida et al. | |
| 9,344,077 B2 | 5/2016 | Callanan | |

* cited by examiner

GAN BASED ADJUSTABLE DRIVER CURRENT CIRCUIT

This application claims the benefit of U.S. Provisional Application No. 62/727,115, filed on Sep. 5, 2018, the entire disclosure of which is hereby incorporated by reference.

BACKGROUND

1. Field of the Invention

The present invention relates generally to current driver circuits, and more particularly to a gallium nitride (GaN) field effect transistor (FET) based current driver circuit with the capability to adjust the output current based on a reference current and to maintain a constant output current for a given reference current despite changes in temperature, circuit impedances, supply voltage, and the like.

2. Description of the Related Art

Typical current driver circuits include a current mirror, a driver, and a control transistor. The reference current input to the current mirror is replicated in the output driving current. The driver receives a control signal indicating the pulses for the driving current and drives the control transistor. The control transistor turns off or on the current mirror based on the control signal, to prevent or enable the current mirror to generate the driving current.

FIG. 1 is a schematic of a conventional current driver circuit 100, which includes a current mirror 120, a control signal driver 140, and its corresponding control transistor 135. Current mirror 120 includes transistors 125 and 130. The drain terminal and the gate terminal of transistor 130 are connected together and receive a reference current $I_{REF}$. The source terminal of transistor 130 is connected to ground 110. The gate terminal of transistor 125 is connected to the gate and drain terminals of transistor 130 and also receives $I_{REF}$. The source terminal of transistor 125 is connected to ground 110.

The drain terminal of transistor 125 is connected to a supply voltage node 115, which provides a high driving supply voltage $V_{HV}$. Transistor 125 generates the output current of current mirror 120, the driver current $I_{DRV}$, by drawing from the high driving supply voltage $V_{HV}$. Transistor 125 acts as a driving transistor, such that when a load, e.g. a laser diode, is connected in series with the supply voltage node 115 and transistor 125, driving current $I_{DRV}$ flows through the laser diode and causes it to output a laser beam.

Control signal driver 140 receives control signal CTL 105 and drives the gate terminal of control transistor 135, which acts as a switch controlling current mirror 120 and driving current $I_{DRV}$. The drain terminal of transistor 135 is connected to the gate terminal of transistor 125 and the gate and drain terminals of transistor 130. The source terminal of transistor 135 is connected to ground 110. In response to control transistor 135 acting as a closed switch, the gate terminals of driving transistor 125 and transistor 130 are connected to ground 110, causing them to act as open switches and preventing reference current $I_{REF}$ and driving current $I_{DRV}$ from flowing through current mirror 120. In response to control transistor 135 acting as an open switch, the voltages on the gate terminals of transistor 130 and driving transistor 125 can increase above the threshold voltage $V_{Th}$, turning them on and allowing current mirror 120 to generate driving current $I_{DRV}$ based on the reference current $I_{REF}$.

Some implementations of current driver circuit 100 such as a light detection and ranging (lidar) system must generate a specific value of the driving current $I_{DRV}$, or a constant value of the driving current $I_{DRV}$, controlled in a feedback system. For example, in a lidar system, a very large driving current $I_{DRV}$ and a very high pulse frequency are used to drive a laser diode and image an environment. To implement the very high pulse frequency, the reference current $I_{REF}$ must be very large and quickly charge the input capacitance $C_{ISS}$ of driving transistor 125. For example, a driving transistor 125 with a $C_{ISS}$ of 600 picoFarads (pF) must be charged to 5 volts (V) in one nanosecond (ns), resulting in an $I_{REF}$ of 3 amperes (A). A current that large, drawn from a supply voltage that quickly, creates substantial supply voltage ripple due to routing impedances such as inductance, resistance, etc. For example, traces with only a single ohm ($\Omega$) impedance result in a 3V drop when 3 A of current passes through.

Further, finer control over the value of the driving current $I_{DRV}$ gives finer control over the intensity of light emitted by the laser diode, which enables the lidar system to adjust the light intensity based on the range of distances the lidar system is imaging. However if, in current driver circuit 100, a fixed voltage is applied to the gate terminal of driving transistor 125 and $I_{REF}$ and transistor 130 omitted, the gate-to-source voltage $V_{GS}$ must turn on driving transistor 125 and generate the desired driving current despite changes based on variations in temperature, circuit impedances, supply voltage as discussed above, and process variation in the transistor technology. As such, the actual driving current $I_{DRV}$ varies greatly over temperature, circuit impedances, supply voltage, and process variation. Such a current driver circuit cannot be used to achieve the desired distance or range resolution required by the lidar system over all environmental or system conditions.

SUMMARY OF THE INVENTION

The present invention addresses the disadvantages of conventional driver circuits, discussed above, by providing a current driver circuit capable of adjusting the output current based on a reference current and maintaining a constant output current for a given reference current despite changes in temperature, circuit impedances, supply voltage, and the like.

The present invention, as described herein, is an adjustable current driver circuit comprising a circuit for charging a storage capacitor from a first supply voltage based on an externally provided reference current, and a pulse controller circuit, responsive to a control signal, for connecting the storage capacitor to the gate of a power transistor to drive and allow current to flow through the power transistor, or for disconnecting the storage capacitor from gate of the power transistor and connecting the gate of the power transistor to ground, to prevent current from flowing through the power transistor.

The circuit for charging the capacitor preferably comprises a current mirror.

The power transistor is preferably a high current, high slew-rate gallium nitride (GaN) field effect transistor (FET) connected to a second supply voltage, the second supply voltage being greater than the first supply voltage. The current mirror and the pulse generator circuit comprise a plurality of GaN FET transistors, all of which are substantially smaller in size than the GaN FET power transistor.

A resistor may be connected to the pulse generator circuit and the power transistor for discharging the charge on the storage capacitor and shutting down the flow of current through the power transistor in the event that the control signal is stuck on.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense and are instead taught merely to describe particularly representative examples of the present teachings.

Figure 2:
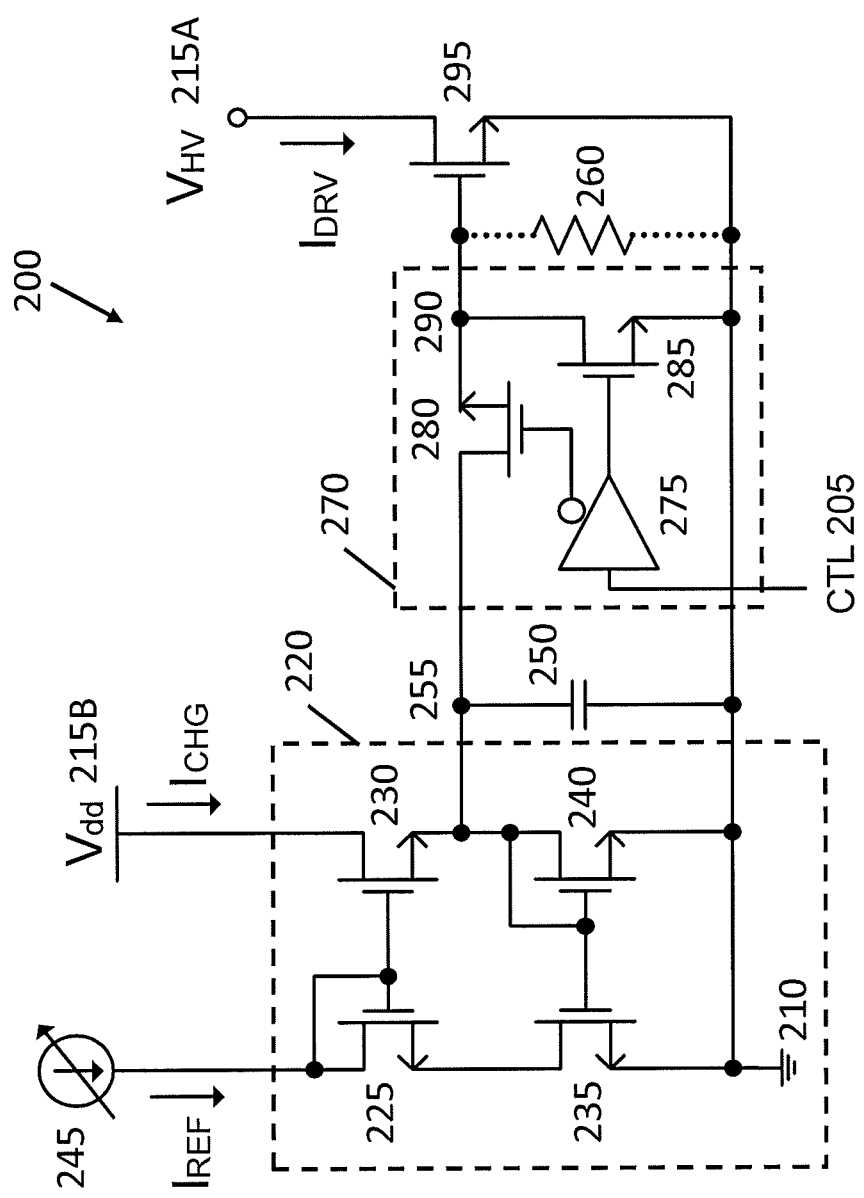
FIG. 2 illustrates an adjustable current driver circuit according to the present invention.

FIG. 2 illustrates an adjustable current driver circuit 200 according to the present invention. As described in detail below, the circuit of the present invention, which can be implemented as a low-power integrated circuit, provides an adjustable output driver current for use in LiDAR or other similar GaN driver applications. The circuit creates an appropriate gate-to-source voltage, $V_{GS}$, for a high-current GaN driver FET 295 to obtain a desired, high slew-rate output current (typically, tens of Gaga-Amps/second). An externally provided reference current $I_{REF}$ is used to create the required $V_{GS}$ needed for the driver FET 295. The $V_{GS}$ created by the circuit adjusts variations in process traits, temperature or supply voltage. The $V_{GS}$ voltage is stored on an external capacitor 250. The value of capacitor 250 far exceeds the parasitic capacitance $C_{ISS}$ of the large GaN driver FET 295, but is still practical in size given the low value of input capacitance for GaN FETs.

When a pulse current of desired value is needed (i.e., when the driver FET 295 needs to be activated), the voltage on capacitor 250 is impinged upon the gate of the driver FET 295 through a pulse controller 270 that connects capacitor 250 to the gate of the driver FET 295, thereby creating the desired and scaled up driver current. When the driver FET 295 is to be turned off, the pulse controller 270 opens the connection to capacitor 250 and shorts the gate of driver FET 295 to ground.

Any charge lost on capacitor 250 due to the charge transfer to driver FET 295 is replenished by the reference charging circuit $I_{CHG}$, which is on the same order of magnitude as the reference current $I_{REF}$, so that the same desired rapid and large driver current can be obtained on the next command pulse to produce the next rapid and large slew-rate pulse. Advantageously, the instantaneous draw of current from the supply to charge the gate of the driver FET 295 is highly reduced due to the charge already being pre-stored in the capacitor prior to the generation of the output current pulse. This reduces supply voltage spiking.

The circuit preferably includes a safe driver shut-down in the event the command signal gets stuck on, as described in further detail below.

Turning now to the details of the preferred embodiment of the invention shown in FIG. 2, adjustable current driver circuit 200 includes current mirror 220, capacitor 250, pulse controller 270, and driving transistor 295. Current mirror 220 receives the reference current $I_{REF}$, in this example from external current source 245, and outputs a charging current $I_{CHG}$ from supply voltage $V_{dd}$ 215B for charging capacitor 250. As shown in FIG. 2, current mirror 220 includes transistors 225, 230, 235, and 240, connected together in a conventional arrangement. Pulse controller 270 includes transistors 280 and 285. Transistors 225, 230, 235, and 240 in current mirror 220, transistors 280 and 285 in pulse controller 270, and driving transistor 295, are all preferably enhancement mode GaN FET semiconductor devices, which are all preferably monolithically integrated onto a single semiconductor die.

Current mirror 220 has a conventional topology, with the gate and drain terminals of transistor 225 connected together and receiving $I_{REF}$, in this example from current source 245. The source terminal of transistor 225 is connected to the drain terminal of transistor 235. The gate terminal of transistor 235 is connected to the gate and drain terminals of transistor 240, and to source terminal of transistor 230, at node 255. The gate terminal of transistor 230 is connected to the gate and drain terminals of transistor 225. The drain terminal of transistor 230 is connected to supply voltage source 215B.

In the operation of the circuit, the charging current $I_{CHG}$ is drawn from supply voltage source 215B by current mirror 220 based on the reference current $I_{REF}$ and charges capacitor 250 to a desired voltage that will be applied to the gate terminal of driving transistor 295. Changes to the value of $I_{REF}$ result in changes in the value of charging current $I_{CHG}$ and the charge stored in capacitor 250. Variation of $I_{REF}$ offers dynamic control of the voltage across capacitor 250, such that capacitor 250 can apply different voltages to the gate terminal of driving transistor 295 in response to variations in temperature, supply voltage, circuit impedances, and process variations. By extension, variation of $I_{REF}$ enables dynamic control of the driving current $I_{DRV}$ through driving transistor 295 by controlling the voltage applied to its gate terminal.

The capacitance of capacitor 250 is much larger than the input capacitance $C_{ISS}$ of driving transistor 295 to ensure it can store charge from $I_{CHG}$ such that the voltage across capacitor 250 is the desired $V_{GS}$ for driving transistor 295. In the preferred embodiment of the invention shown in FIG. 2, current mirror 220 receives the reference current $I_{REF}$ and generates the charging current $I_{CHG}$ from supply voltage source 215B to control the supply voltage $V_{dd}$ available for adjustable current driver circuit 200. In other implementations, the reference current $I_{REF}$ is applied directly to node 255 and directly charges capacitor 250.

In accordance with the present invention, the near-instantaneous energy needed for driving transistor 295 is largely drawn from the charge stored on capacitor 250, rather than from a supply voltage source, which greatly reduces supply voltage spiking from the near-instantaneous current draw from the supply voltage source. The reduced supply voltage spiking reduces resistive and inductive noise spikes in other pre-driver circuits as well. Charge drawn from capacitor 250 is replenished by $I_{CHG}$ while driving transistor 295 acts as an open switch. $I_{CHG}$ is a similar order of magnitude as $I_{REF}$ and is sufficient to recharge capacitor 250 in between pulses of transistor 295 despite its much smaller magnitude. To illustrate using an example, the driving current $I_{DRV}$ pulses every microsecond (μs), and driving transistor 295 acts as a closed switch for 5 ns. $I_{CHG}$ charges capacitor 250 over the intervening 995 ns before the next pulse of driving current $I_{DRV}$.

Pulse controller 270 is connected at its input to node 255 and at its output to the gate terminal of driving transistor 295 at node 290, and receives a control signal CTL 205. Controller 270 includes driver 275 and transistors 280 and 285. Driver 275 receives CTL 205 and is connected to the gate terminals of transistors 280 and 285. The drain terminal of transistor 280 is connected to node 255, and the source terminal of transistor 280 is connected to the gate terminal of driving transistor 295 at node 290. The drain terminal of transistor 285 is connected to the gate terminal of driving transistor 295 and the source terminal of transistor 280 at node 290.

When CTL 205 indicates driving transistor 295 should be turned on and the driving current $I_{DRV}$ generated, transistor 285 acts as an open switch, disconnecting the gate terminal of driving transistor 295 from ground 210. Transistor 280 acts as a closed switch, connecting the gate terminal of transistor 295 to capacitor 250 at node 255. Charge stored in capacitor 250 increases the voltage on the gate terminal of driving transistor 295 above its threshold voltage $V_{Th}$, causing it to turn on and generate a driving current $I_{DRV}$ proportional to $I_{REF}$. When CTL 205 indicates driving transistor 295 should be turned off, transistor 280 acts as an open switch, disconnecting the gate terminal of driving transistor 295 from capacitor 250. Transistor 285 acts as a closed switch, connecting the gate terminal of driving transistor 295 to ground 210, and causes the gate voltage of driving transistor 295 to quickly decrease to ground.

The drain terminal of driving transistor 295 is connected to a second supply voltage source 215A, which provides a supply voltage $V_{HV}$ that is much higher than the supply voltage $V_{dd}$ from supply voltage source 215B. The source terminal of driving transistor 295 is connected to ground 210. The driving current $I_{DRV}$ is drawn from the second supply voltage source 215A.

In some implementations, a resistor 260 is connected to node 290 and ground 210 as a safety feature, in the event pulse controller 270 malfunctions and causes driving transistor 295 to be turned on for more than a predetermined safety threshold length of time. Resistor 260 discharges capacitor 250 to zero over a period of time, in response to CTL 205 or pulse controller 270 indicating driving transistor 295 is to be turned on for more than the safety threshold length of time. By discharging capacitor 250 over time, resistor 260 reduces the gate voltage of driving transistor 295 below its threshold voltage $V_{Th}$, turning off driving transistor 295 and stopping flow of driving current $I_{DRV}$. The resistance of resistor 260 is chosen to implement the desired safety threshold length of time before driving transistor 295 is turned off.

Figure 1:
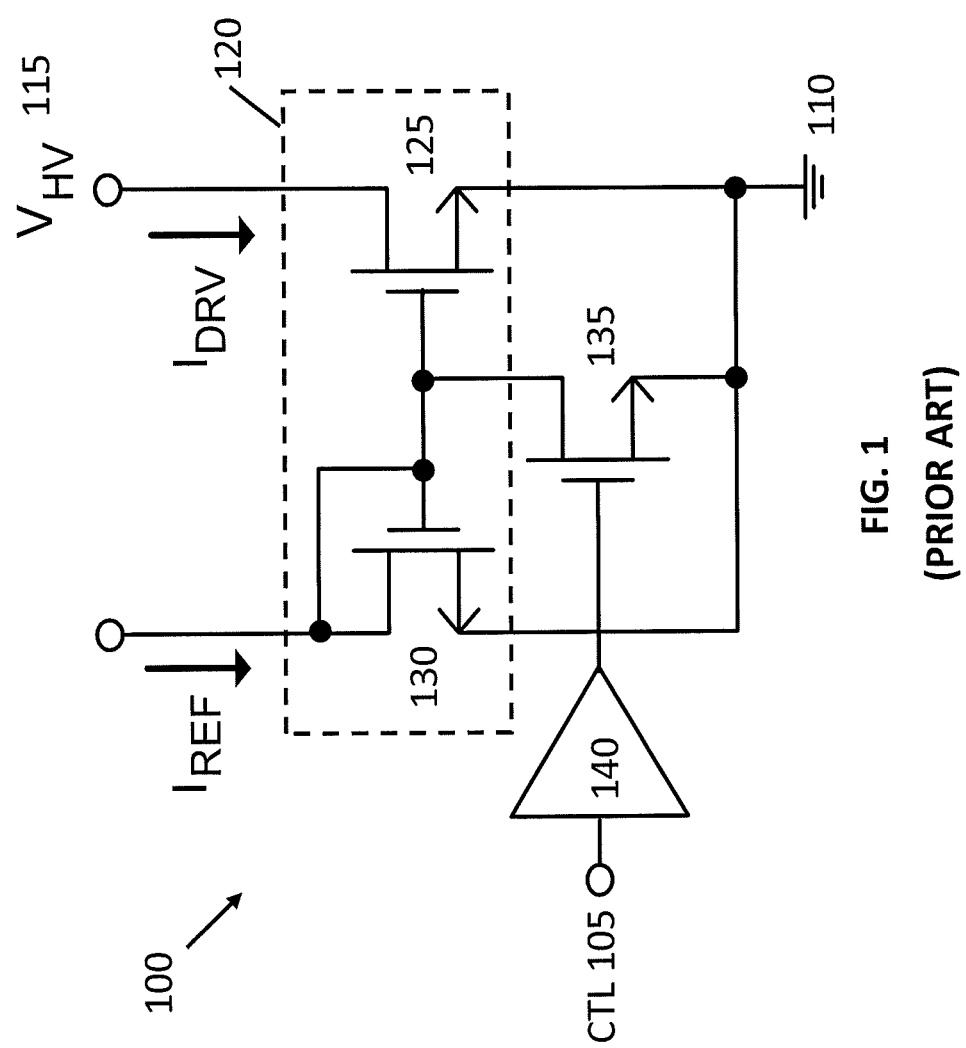
FIG. 1 illustrates schematics of a conventional current driver circuit.

As discussed previously herein, the reference current $I_{REF}$ is highly scaled down compared to the $I_{REF}$ input to current driver circuit 100 shown in FIG. 1. The much larger driving current $I_{DRV}$ is drawn from the much larger supply voltage source 215A and is achieved based on the relative sizes of transistors in current mirror 220 compared to driving transistor 295. For example, transistors 235 and 240 are substantially the same size, and driving transistor 295 is approximately 30,000 times the size of transistors 235 and 240. A driving current $I_{DRV}$ equal to 30 A is achieved with a reference current $I_{REF}$ of only 1 mA. Thus, a small reference current $I_{REF}$ is sufficient to generate a driving current $I_{DRV}$ several orders of magnitude larger that slews on the order of tens of GA/second with a reduced impact on the supply voltage available in the integrated circuit. Varying the magnitude of $I_{REF}$ proportionally varies the magnitude of $I_{DRV}$.

Returning to the exemplary implementation of adjustable current driver circuit as part of a lidar system, varying the magnitude of $I_{REF}$ proportionally varies the magnitude of IDR and the corresponding intensity of light emitted by the laser diode driven by $I_{DRV}$. Thus, the lidar system can carefully control the light intensity based on the range of distances it is imaging and environmental conditions. $I_{DRV}$ can be dynamically adjusted as the lidar system images the environment to accommodate changes in the environmental conditions as well. Dynamic adjustment of $I_{DRV}$ enables the lidar system to adjust for different distances, maintain a constant light intensity over different environmental and process conditions, and/or modulate the light intensity over time to implement a time-of-flight imaging process.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. An adjustable current driver circuit, comprising:
   a circuit comprising a current mirror for charging a storage capacitor from a first supply voltage based on an externally provided reference current; and
   a pulse controller circuit, responsive to a control signal, for connecting the storage capacitor to a gate of a power transistor to drive and allow driving current to flow through the power transistor, or for disconnecting the storage capacitor from the gate of the power transistor and connecting the gate of the power transistor to ground, to prevent driving current from flowing through the power transistor.

2. The adjustable current driver circuit of claim 1, wherein the power transistor comprises a first gallium nitride (GaN) field effect transistor (FET) connected to a second supply voltage, wherein the second supply voltage is greater than the first supply voltage.

3. The adjustable current driver circuit of claim 2, wherein the current mirror comprises a plurality of GaN FET transistors, and the pulse controller circuit comprises a plurality a GaN FET transistors, all of the GaN FET transistors of the current mirror and the pulse controller circuit being substantially smaller in size than the GaN FET power transistor controlled by the driver circuit.

4. The adjustable current driver circuit of claim 1, wherein the storage capacitor has a capacitance greater than an input capacitance of the power transistor.

5. The adjustable current driver circuit of claim 1, further comprising a resistor connected to the pulse controller circuit and the power transistor for discharging the charge on the storage capacitor and shutting down the flow of the driving current through the power transistor in the event that the control signal is stuck on.

* * * * *